US007116591B2

(12) United States Patent
Min et al.

(10) Patent No.: US 7,116,591 B2
(45) Date of Patent: Oct. 3, 2006

(54) REDUNDANCY CIRCUITS AND MEMORY DEVICES HAVING A TWIST BITLINE SCHEME AND METHODS OF REPAIRING DEFECTIVE CELLS IN THE SAME

(75) Inventors: Young-sun Min, Seoul (KR); Nam-jong Kim, Gyeonggi-do (KR)

(73) Assignee: Samsung Electronics Co. Ltd., (KR)

( * ) Notice: Subject to any disclaimer, the term of this patent is extended or adjusted under 35 U.S.C. 154(b) by 20 days.

(21) Appl. No.: 11/089,286

(22) Filed: Mar. 24, 2005

(65) Prior Publication Data
US 2005/0276128 A1 Dec. 15, 2005

(30) Foreign Application Priority Data
Jun. 11, 2004 (KR) .................... 10-2004-0042911

(51) Int. Cl.
*G11C 29/18* (2006.01)
(52) U.S. Cl. .................... 365/200; 365/230.03
(58) Field of Classification Search ............... None
See application file for complete search history.

(56) References Cited

U.S. PATENT DOCUMENTS

| | | | | |
|---|---|---|---|---|
| 6,292,383 B1 * | 9/2001 | Worley | .................. | 365/69 |
| 6,434,064 B1 | 8/2002 | Nagai | .................. | 365/200 |
| 6,480,429 B1 | 11/2002 | Jones et al. | .................. | 365/200 |
| 6,570,794 B1 * | 5/2003 | Hokenmaier et al. | ....... | 365/200 |
| 6,950,352 B1 * | 9/2005 | Jung et al. | .................. | 365/200 |
| 2001/0055233 A1 | 12/2001 | Nagai | .................. | 365/225.7 |

FOREIGN PATENT DOCUMENTS

| | | |
|---|---|---|
| JP | 2002015593 | 12/2001 |
| KR | 2000-0018206 | 10/2000 |
| KR | 010004579 | 1/2001 |

* cited by examiner

*Primary Examiner*—Tan T. Nguyen
(74) *Attorney, Agent, or Firm*—Myers Bigel Sibley & Sajovec

(57) ABSTRACT

Redundancy circuits are provided for an integrated circuit memory device including a first memory cell block including a plurality of primary wordlines and a spare wordline, each associated with a plurality of memory cells; a second memory cell block including a plurality of primary wordlines and a spare wordline, each associated with a plurality of memory cells; and a plurality of bitlines extending across both the first and the second memory cell blocks the plurality of bitlines having a twisted bitline structure in which the bitlines are twisted between the first memory cell block and the second memory cell block and are not twisted within the respective memory cell blocks. The redundancy circuit is coupled to the primary and spare wordlines of both the first memory cell block and the second memory cell block. The redundancy circuit is also configured to select the spare wordline of the first memory cell block to replace one of the primary wordlines of the first memory cell block associated with a defective cell and to select the spare wordline of the second memory cell block to replace one of the primary wordlines of the second memory cell block associated with a defective cell so that data stored in spare cells connected to a selected spare wordline have a same data scramble as that of cells connected to the correspond.

18 Claims, 6 Drawing Sheets

REDUNDANCY CIRCUITS AND MEMORY DEVICES HAVING A TWIST BITLINE SCHEME AND METHODS OF REPAIRING DEFECTIVE CELLS IN THE SAME

CROSS-REFERENCE TO RELATED APPLICATION

This application claims the priority of Korean Patent Application No. 2004-42911, filed on Jun. 11, 2004, the disclosure of which is hereby incorporated herein by reference in its entirety.

BACKGROUND OF THE INVENTION

The present invention relates to integrated circuit devices and, more particularly, to redundancy circuits for memory devices and methods of repairing defective cells.

As the cell density of semiconductor memory devices, such as dynamic random access memories (DRAMs), increases, the interval between bitlines thereof generally decreases. As a result, bitline coupling noise may be significantly increased during sensing of memory cell data. A twist bitline scheme has been proposed to reduce bitline coupling noise.

In the twist bitline design, a bitline BL and a complementary bitline $\overline{BL}$ are typically twisted at regular intervals. By adequately controlling the layout arrangement between an odd column and an even column, a bitline coupling noise generated by a bitline BL and a complementary bitline $\overline{BL}$ in a column may be offset by a bitline coupling noise received from bitlines in an adjacent column. Consequently, the bitline coupling noises in the two adjacent columns may be reduced or even eliminated.

When a defective cell is detected in a memory cell array having this twist bitline design, the defective cell is typically repaired by replacement with spare cell (or a redundancy cell). Consequently, a semiconductor production yield may be improved using a redundancy cell. In the twist bitline design having twisted bitlines, memory cells connected to one wordline generally have different data scrambles according to their locations.

FIG. 1 illustrates a data scrambling that may occur after repairs in a twist bitline design and a folded bitline design. As shown in FIG. 1, first bitline and complementary bitline BL0 and $\overline{BL0}$ form a twist bitline design (scheme), and second bitline and complementary bitline BL1 and $\overline{BL1}$ form a folded bitline design (scheme). In FIG. 1, memory cells are defined by the first bitline and complementary bitline BL0 and $\overline{BL0}$, and the second bitline and complementary bitline BL1 and $\overline{BL1}$ and first through fourth wordlines WL0 through WL3 that cross the bitlines BL0, $\overline{BL0}$, BL1, and $\overline{BL1}$. For the device of FIG. 1, when a data pattern (value) stored in a memory cell is 1, the data pattern is represented as T(True). When a data pattern stored in a memory cell is 0, the data pattern is represented as C(Complement).

It is assumed for purposes of this description that the memory cells connected to the first through fourth wordlines WL0 through WL3 in the twist bitline structure store a "TCCT" data pattern. If these memory cells are defective, and the first through fourth wordlines WL0 through WL3 are replaced by first through fourth spare wordlines SWL0 through SWL3, spare cells connected to the first through fourth spare wordlines SWL0 through SWL3 store a "CTTC" data pattern, because the bitlines are twisted. In other words, data scrambling occurs. In this case, during final defective cell screening after primary defective cell repairing, defective cells may not be screened or normal cells may have a high risk of being detected as defective cells based on lack of information about the data scrambling.

In contrast, for the folded bitline scheme, if the memory cells connected to the first through fourth wordlines WL0 through WL3 are defective and replaced by the spare cells connected to the first through fourth spare wordlines SWL0 through SWL3, the spare cells store a TCCT data pattern the same as the TCCT data pattern stored by the memory cells connected to the first through fourth wordlines WL0 through WL3.

Thus, to repair a defective cell in a twist bitline scheme, if bitlines are twisted once, a spare wordline for repairing a wordline connected to the defective cell (hereinafter, referred to as a defective wordline) typically must exist on each side of a place where the bitlines are twisted, so that data are stored in spare cells connected to the spare wordline to have the same data scramble as that of the defective cell in the folded bitline scheme.

However, to repair a defective wordline with a spare wordline in the twist bitline scheme, an address fuse cutting portion for repairing an address corresponding to the defective wordline with an address corresponding to the spare wordline typically must be installed in the spare wordline. In other words, each spare wordline typically requires an address fuse cutting portion. Because the address fuse cutting portion generally occupies a large area of a layout of a memory device. A chip size of the memory device generally proportionally increases as a number of memory cells having different data scrambles increases.

SUMMARY OF THE INVENTION

In some embodiments of the present invention, redundancy circuits are provided for an integrated circuit memory device including a first memory cell block including a plurality of primary wordlines and a spare wordline, each associated with a plurality of memory cells; a second memory cell block including a plurality of primary wordlines and a spare wordline, each associated with a plurality of memory cells; and a plurality of bitlines extending across both the first and the second memory cell blocks the plurality of bitlines having a twist bitline structure in which the bitlines are twisted between the first memory cell block and the second memory cell block and are not twisted within the respective memory cell blocks. The redundancy circuit is coupled to the primary and spare wordlines of both the first memory cell block and the second memory cell block. The redundancy circuit is also configured to select the spare wordline of the first memory cell block to replace one of the primary wordlines of the first memory cell block associated with a defective cell and to select the spare wordline of the second memory cell block to replace one of the primary wordlines of the second memory cell block associated with a defective cell so that data stored in spare cells connected to a selected spare wordline have a same data scramble as that of cells connected to the corresponding replaced one of the primary wordlines.

In further embodiments of the present invention, integrated circuit memory devices are provided including a redundancy circuit of the present invention. The memory devices include a first memory cell block including a plurality of primary wordlines and a spare wordline, each associated with a plurality of memory cells and a second memory cell block including a plurality of primary wordlines and a spare wordline, each associated with a plurality of memory cells. A plurality of bitlines extend across both the first and the second memory cell blocks. The plurality of bitlines have a twist bitline structure in which the bitlines are twisted between the first memory cell block and the second memory cell block and are not twisted within the respective memory cell blocks.

In other embodiments of the present invention, the redundancy circuit includes a first block address portion that generates addresses associated with the first memory cell block and a second block address portion that generates addresses associated with the second memory cell block. A programmable portion designates a repair address associated with a spare wordline to replace a defective cell. A coding portion selects the spare wordline of the first memory cell block to replace the one of the primary wordlines of the first memory cell block associated with a defective cell responsive to the repair address from the programmable portion and an address from the first block address portion and selects the spare wordline of the second memory cell block to replace the one of the primary wordlines of the second memory cell block associated with a defective cell responsive to the repair address from the programmable portion and an address from the second block address portion.

In further embodiments of the present invention, each of the first and second memory cell blocks include a plurality of spare wordlines. The integrated circuit memory device may include at least three memory cell blocks and the plurality of bitlines may extend across the at least three memory cell blocks and have a twist bitline structure in which the bitlines are twisted between adjacent ones of the at least three memory cell blocks and are not twisted within the respective memory cell blocks. The reduncany circuit may be coupled to each of the at least three memory cell blocks and be configured to select a spare wordline from a same one of the at least three memory cell blocks to replace one of the primary wordlines of the same one of the at least three memory cell blocks associated with a defective cell so that data stored in spare cells connected to a selected spare wordline have a same data scramble as that of cells connected to the corresponding replaced one of the primary wordlines.

In yet other embodiments of the present invention, the programmable portion is a fuse portion including a plurality of fuses configured to be programmed to generate the repair address. The fuse portion may program the fuses by shorting or cutting the fuses according to the address of a defective cell. The coding portion may include a first NAND gate coupled to the first memory cell block that receives the repair address and an address from the first block addressing portion and a second NAND gate coupled to the second memory cell block that receives the repair address and an address from the second block addressing portion. An address line selecting a defective cell may be cut off.

In further embodiments of the present invention, redundancy circuits for repairing a defective cell generated in a memory device having a twist bitline scheme are provided. The redundancy circuit includes a fuse portion including a plurality of fuses and is configured to program the fuses to generate a repair address suitable for an address of the defective cell. Block addressing portions generate block addresses for addressing memory cell array blocks, respectively, of the memory device that are divided based on a bitline twisting place. Coding portions each select a spare wordline in response to the repair address and a block address for selecting a memory cell array block that has the defective cell. The redundancy circuit may be shared by the memory cell array blocks.

In other embodiments of the present invention, the fuse portion programs the fuses by shorting or cutting the fuses according to the address of the defective cell. The coding portions may be NAND gates receiving the repair address and the block addresses, respectively. An address line selecting a defective cell may be cut off. The spare wordline may be arranged in each of the memory cell array blocks.

In yet other embodiments of the present invention, methods of repairing a defective cell generated in a memory device having a twist bitline scheme include programming fuses to generate a repair address suitable for an address of the defective cell. A block address signal is generated for selecting a memory cell array block having the defective cell from memory cell array blocks of the memory device that are divided based on a bitline twisting scheme. A spare wordline is selected in the memory cell array block having the defective cell in response to the repair address and the block address signal. An address line may be cut for selecting the defective cell. In the programming of the fuses, the fuses may be shorted or cut according to the address of the defective cell.

In some embodiments of the present invention, the memory cell array blocks across which twisted bitlines are arranged share the single redundancy circuit, so a chip area of the memory device may not be large. Also, the single redundancy circuit may maintain the same redundancy efficiency as that obtained by a plurality of redundancy circuits required by memory cell array blocks based on a conventional twist bitline scheme.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
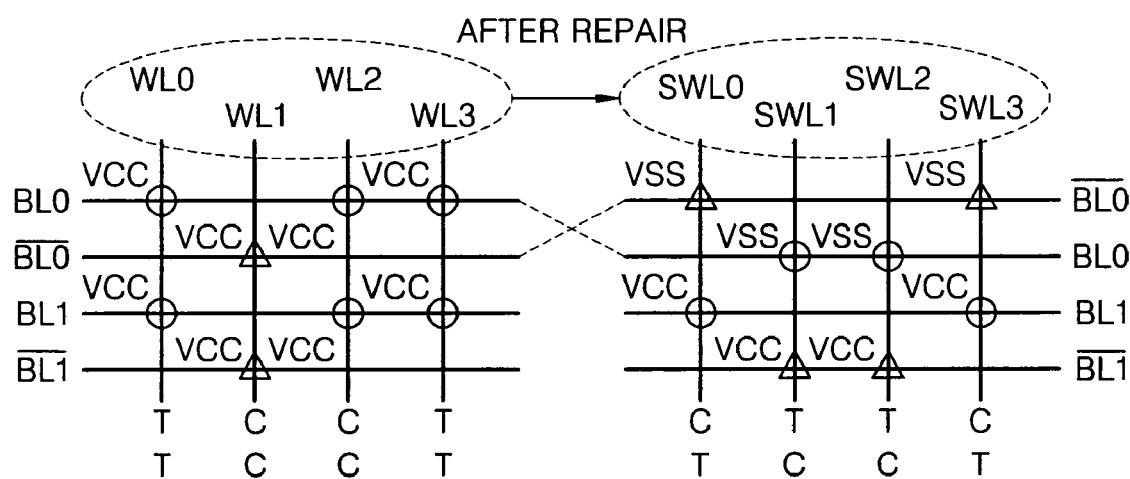
FIG. 1 is a schematic diagram illustrating conventional data scrambling that may occur after defective cell repairs in a twist bitline scheme and a folded bitline scheme.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
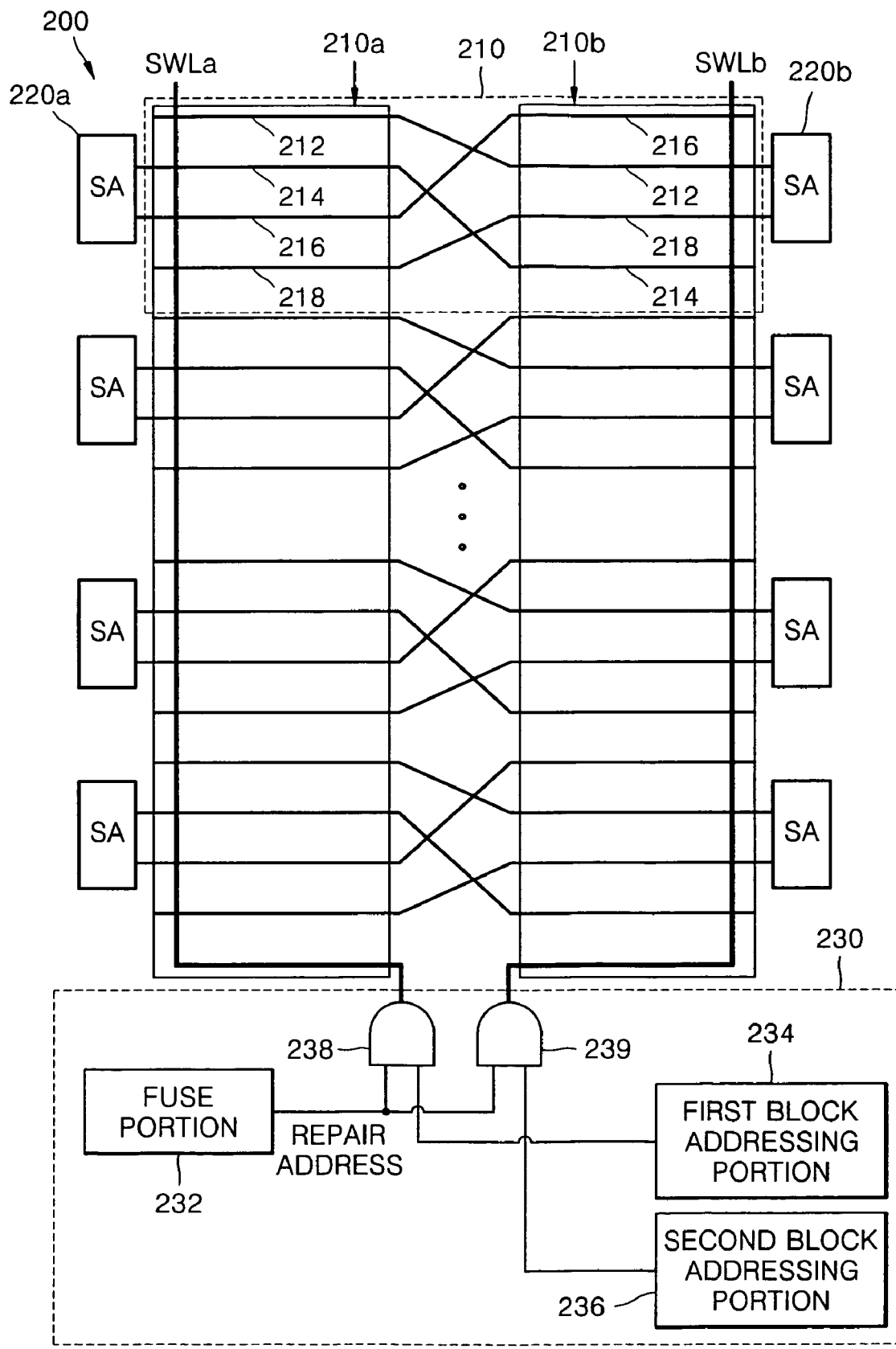
FIG. 2 is a block diagram illustrating a memory device having a first type twist bitline scheme, which uses a redundancy circuit according to some embodiments of the present invention.

FIG. 2 is a block diagram illustrating a memory device 200 having a first type of twist bitline scheme, which uses a redundancy circuit 230 according to some embodiments of the present invention. The memory device 200 includes twisted bitlines arranged across a first memory cell array block 210a and a second memory cell array block 210b. The first and second memory cell array blocks 210a and 210b have different data scrambles because of the twisted bit lines.

To repair defective cells in the first and second memory cell array blocks 210a and 210b and to make spare cells have the same data scrambles as those of the defective cells upon testing, a wordline (not shown) connected to a defective cell in the first memory cell array block 210a is replaced by a first spare wordline SWLa arranged in the first memory cell array block 210a by the redundancy circuit 230, and a wordline (not shown) connected to a defective cell in the second memory cell array block 210b is replaced by a second spare wordline SWLb arranged in the second memory cell array block 210b by the redundancy circuit 230. Accordingly, the defective cells are replaced by spare cells connected to spare wordlines.

The illustrated twist bitline scheme has a unit configuration 210 of twisted bitlines in which first, second, third, and fourth bitlines 212, 214, 216, and 218 are sequentially arranged in the first memory cell array block 210a and they are arranged in the second memory cell array block 210b in a sequence of third, first, fourth, and second bitlines 216, 212, 218, and 214. The second and third bitlines 214 and 216 are connected to a bitline sense amplifier 220a proximate the first memory cell array block 210a. The first and fourth bitlines 212 and 218 are connected to a bitline sense amplifier 220b proximate the second memory cell array block 210b. The first bitline sense amplifier 220a senses and amplifies a voltage difference between the second and third bit lines 214 and 216. The second bitline sense amplifier 220b senses and amplifies a voltage difference between the first and fourth bit lines 212 and 218.

The redundancy circuit 230 includes a fuse portion 232, first and second block addressing portions 234 and 236, and first and second coding portions 238 and 239. The first and second block addressing portions 234 and 236 provide block addresses for selecting the first and second memory cell array blocks 210a and 210b to the first and second coding portions 238 and 239, respectively. The fuse portion 232 includes a plurality of fuses connected to address signal lines. Shorts or cuts of the fuses are used to generate a repair address corresponding to an address for selecting a word line of a defective cell in the first or second memory cell array block 210a or 210b, and the fuse portion 232 provides the repair address to the first and second coding portions 238 and 239. The first and second coding portions 238 and 239 select the first and second spare wordline SWLa and SWLb, respectively, in response to the repair address and outputs of the first and second block addressing portions 234 and 236.

When a wordline connected to a defective cell in the first memory cell array block 210a is selected, the first spare wordline SWLa is selected to replace the defective wordline. When a wordline connected to a defective cell in the second memory cell array block 210b is selected, the second spare wordline SWLb is selected to replace the defective wordline. At this time, output lines of an address decoder (not shown) that are connected to defective word lines are cut off.

Accordingly, the redundancy circuit 230 may be shared by the first and second memory cell array blocks 210a and 210b and selects either the first or second spare wordline SWLa or SWLb depending on an output of the first or second block addressing portions 234 or 236, which selects a memory cell array block having a defective cell. A data scramble having the same data pattern as that applied to the defective cell upon testing may be reproduced without change in a spare cell connected to the first or second wordline SWLa or SWLb. As such, in some embodiments of the present invention, the redundancy circuit 230 does not increase a chip size of a memory device. Also, the redundancy circuit 230 may have the same redundancy efficiency as that provided by conventional redundancy circuits installed on both sides of a twisted bitline.

Figure 3:
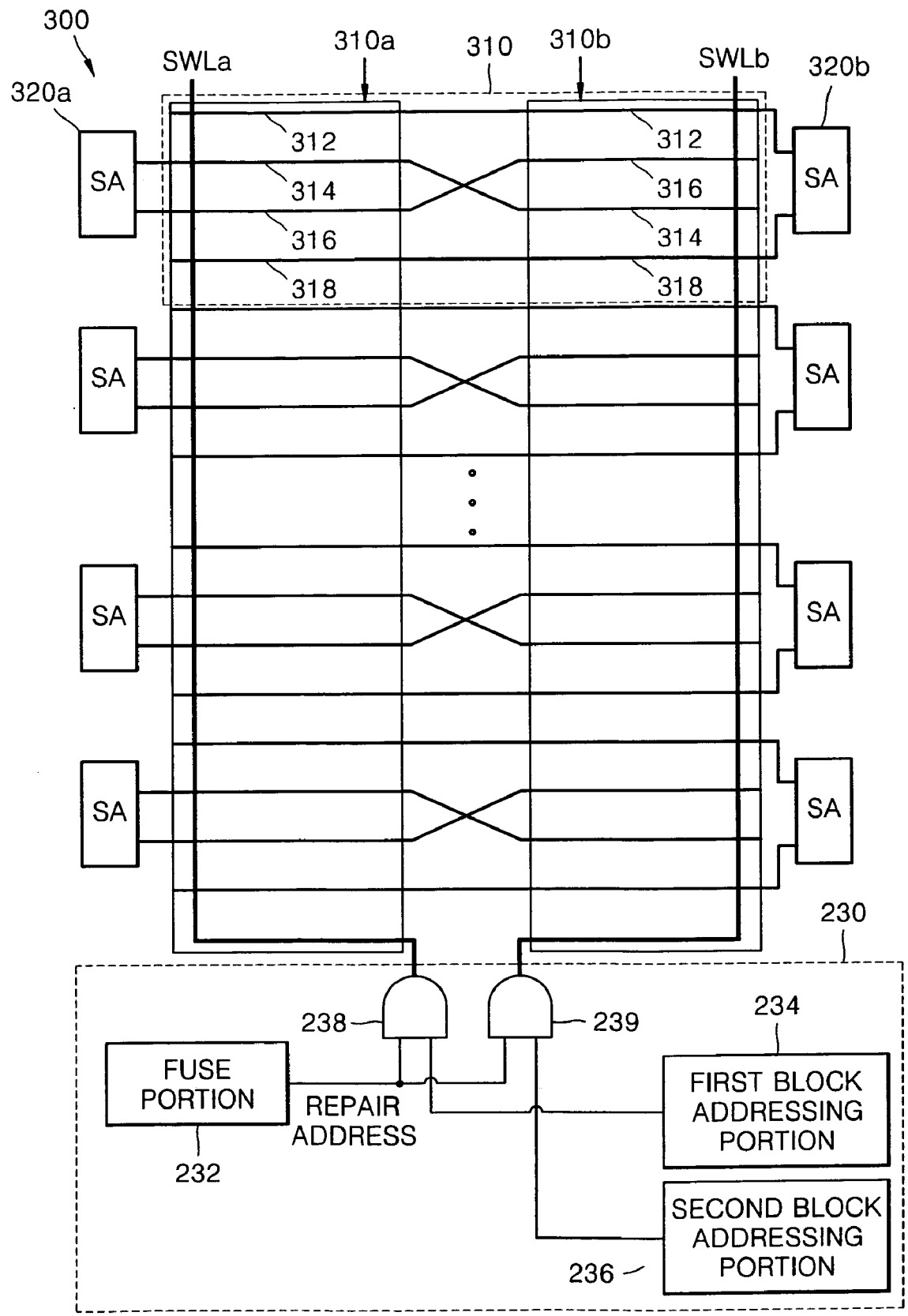
FIG. 3 is a block diagram illustrating a memory device having a second type twist bitline scheme, which uses a redundancy circuit according to some embodiments of the present invention.

FIG. 3 is a block diagram of a memory device 300, having another type twist bitline scheme, which uses the redundancy circuit 230 of FIG. 2. In the memory device 300 having the second type twist bitline scheme, a wordline (not shown) connected to a defective cell in the first or second memory cell array block 310a or 310b is replaced by either a first or second spare wordline SWLa or SWLb selected depending on an output of either the first or second block addressing portion 234 or 236 by the redundancy circuit 230.

The second type twist bitline scheme has a unit configuration 310 of twisted bitlines in which first, second, third, and fourth bitlines 312, 314, 316, and 318 are sequentially arranged in the first memory cell array block 310a and they are arranged in the second memory cell array block 310b in sequence of the first, third, second, and fourth bitlines 312, 316, 314, and 318. The second and third bitlines 314 and 316 are connected to a bitline sense amplifier 320a proximate the first memory cell array block 310a. The first and fourth bitlines 312 and 318 are connected to a bitline sense amplifier 320b near the second memory cell array block 310b. The first bitline sense amplifier 320a senses and amplifies a voltage difference between the second and third bit lines 314 and 316. The second bitline sense amplifier 320b senses and amplifies a voltage difference between the first and fourth bit lines 312 and 318.

Figure 4:
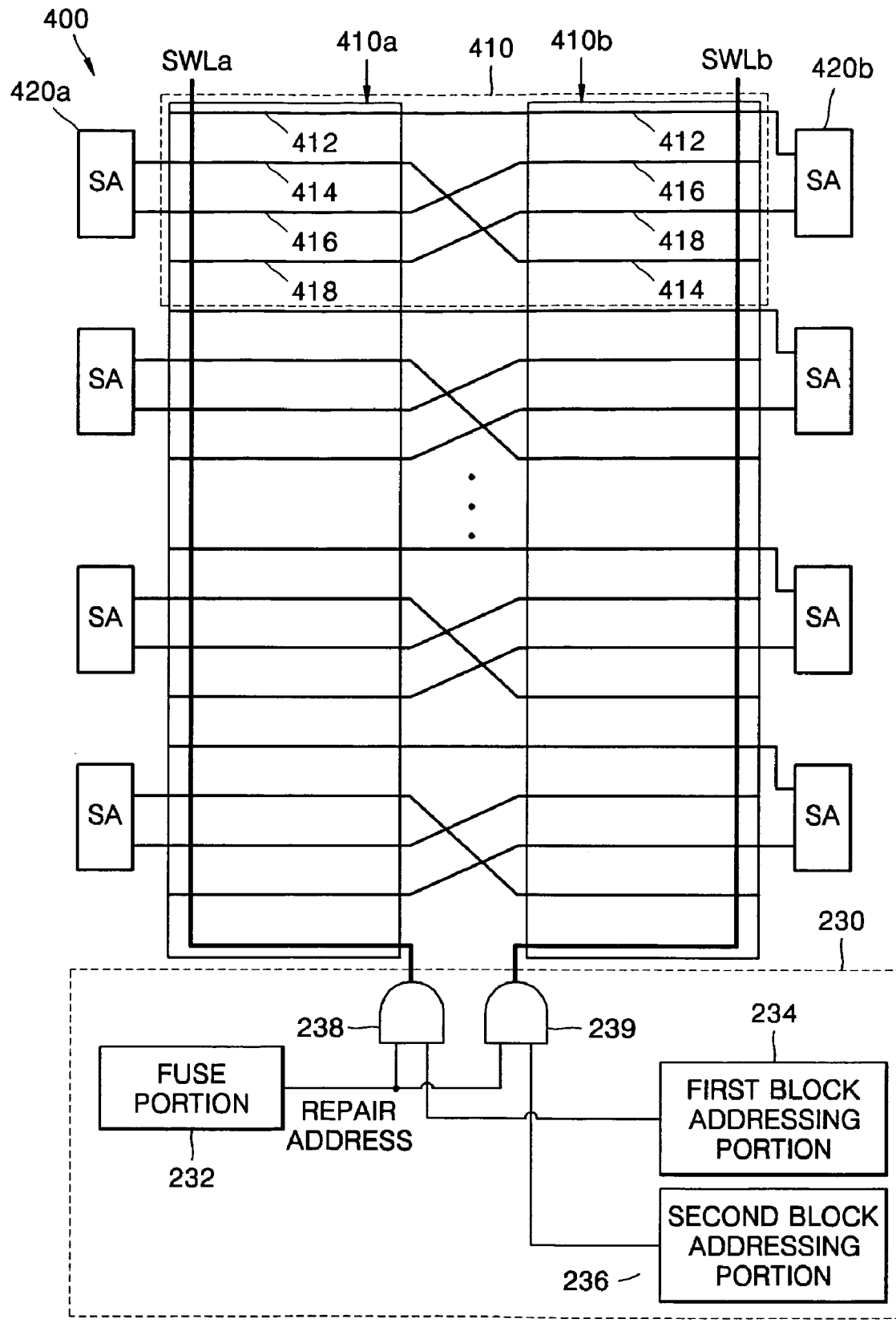
FIG. 4 is a block diagram illustrating a memory device having a third type twist bitline scheme, which uses a redundancy circuit according to some embodiments of the present invention.

FIG. 4 is a block diagram of a memory device 400 having another type twist bitline scheme, which uses the redundancy circuit 230. In the memory device 400 having the third type twist bitline scheme, a wordline (not shown) connected to a defective cell in the first or second memory cell array block 410a or 410b is replaced by either a first or second spare wordline SWLa or SWLb selected depending on an output of either the first or second block addressing portion 234 or 236 by the redundancy circuit 230.

The third type twist bitline scheme has a unit configuration 410 of twisted bitlines in which first, second, third, and fourth bitlines 412, 414, 416, and 418 are sequentially arranged in the first memory cell array block 410a and they are arranged in the second memory cell array block 410b in sequence of the first, third, fourth, and second bitlines 412, 416, 418, and 414. The second and third bitlines 414 and 416 are connected to a bitline sense amplifier 420a proximate the first memory cell array block 410a. The first and fourth bitlines 412 and 418 are connected to a bitline sense amplifier 420b proximate the second memory cell array block 410b. The first bitline sense amplifier 420a senses and amplifies a voltage difference between the second and third bit lines 414 and 416. The second bitline sense amplifier 420b senses and amplifies a voltage difference between the first and fourth bit lines 412 and 418.

Figure 5:
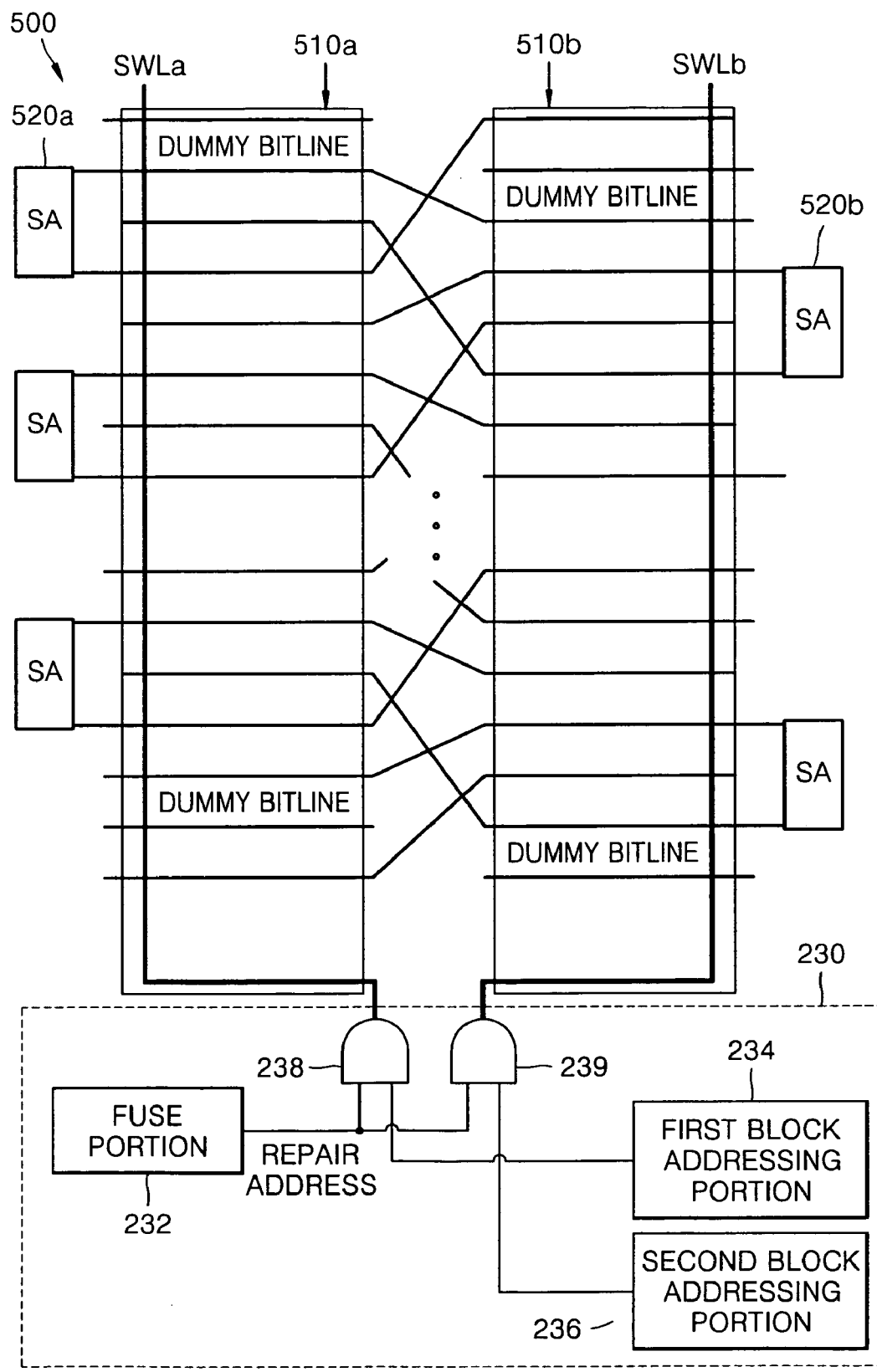
FIG. 5 is a block diagram illustrating a memory device having a fourth type twist bitline scheme, which uses a redundancy circuit according to some embodiments of the present invention.

FIG. 5 is a block diagram of a memory device 500 having yet another type twist bitline scheme, which uses the redundancy circuit 230. In the memory device 500 having the fourth type twist bitline scheme, a wordline (not shown) connected to a defective cell in a first or second memory cell array block 510a or 510b, including dummy bitlines, is replaced by either a first or second spare wordline SWLa or SWLb selected depending on an output of either the first or second block addressing portion 234 or 236 by the redundancy circuit 230.

Figure 6:
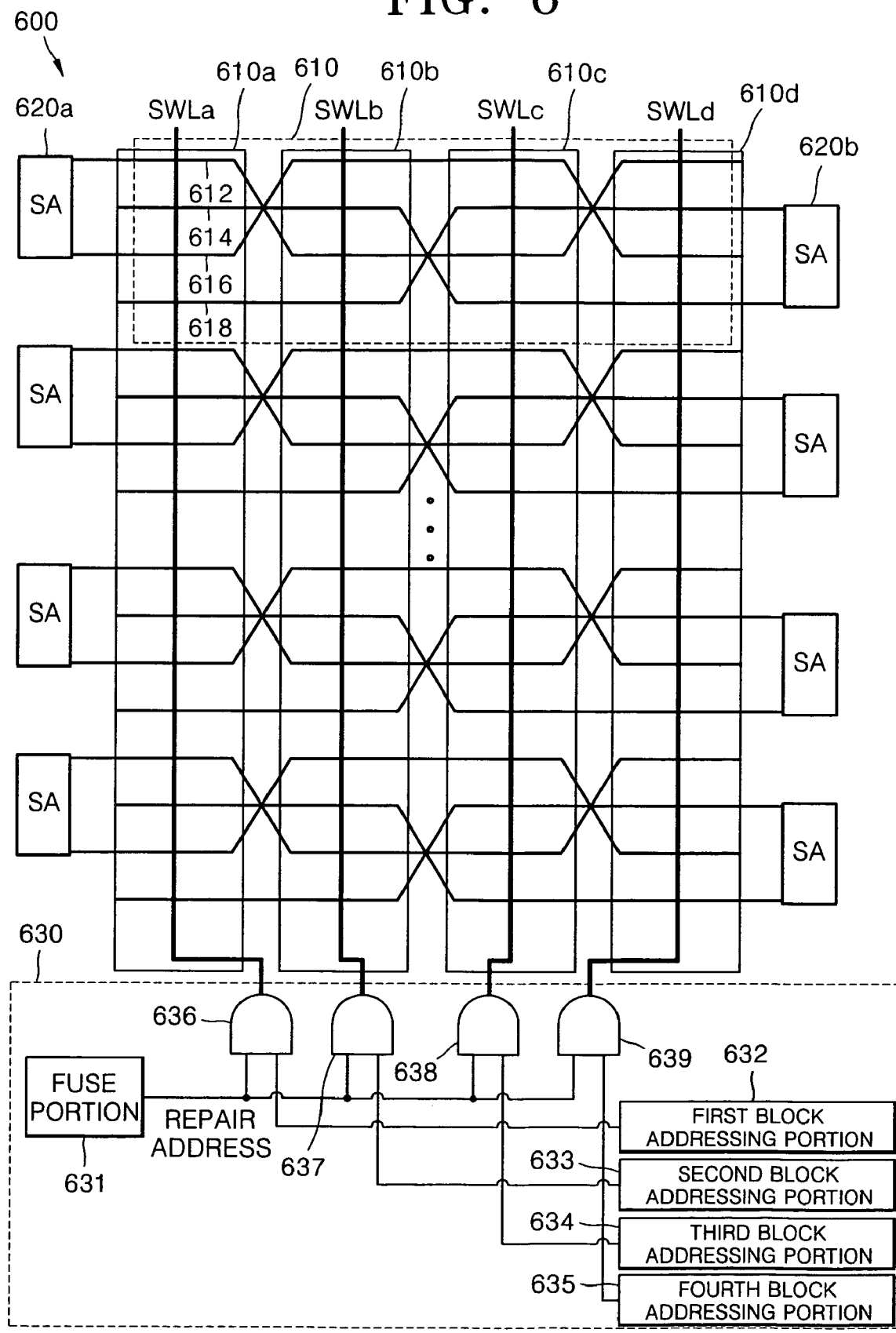
FIG. 6 is a block diagram illustrating a memory device having a fifth type twist bitline scheme, which uses a redundancy circuit according to some embodiments of the present invention.

FIG. 6 is a block diagram of a memory device 600 having another type twist bitline scheme, which uses a redundancy circuit 630 according to further embodiments of the present invention. In the memory device 600, twisted bitlines are arranged across first through fourth memory cell array blocks 610a, 610b, 610c, and 610d. The fifth type twist bitline scheme has a unit configuration 610 of twisted bitlines in which first and third bitlines 612 and 616 are first twisted between first and second memory cell array blocks 610a and 610b and twisted again between third and fourth memory cell array blocks 610c and 610d. Second and fourth bitlines 614 and 618 are twisted once between the second and third memory cell array blocks 610b and 610c. Hence, the first through fourth cell array blocks 610a through 610d have different data scrambles because of the twisted bit lines.

To repair defective cells in the first through memory cell array blocks 610a through 610d and make spare cells have the same data scrambles as those of the defective cells upon testing, the redundancy circuit 630 is used. More specifically, a wordline (not shown) connected to a defective cell in the first memory cell array block 610a is replaced by a first spare wordline SWLa arranged in the first memory cell array block 610a. A wordline (not shown) connected to a defective cell in the second memory cell array block 610b is replaced by a second spare wordline SWLb arranged in the second memory cell array block 610b. A wordline (not shown) connected to a defective cell in the third memory cell array block 610c is replaced by a third spare wordline SWLc arranged in the third memory cell array block 610c. A wordline (not shown) connected to a defective cell in the fourth memory cell array block 610d is replaced by a fourth spare wordline SWLd arranged in the fourth memory cell array block 610d. Accordingly, the defective cells of the first through fourth cell array blocks 610a, 610b, 610c, and 610d are replaced by spare cells connected to the spare wordlines SWLa, SWLb, SWLc, and SWLd.

The redundancy circuit 630 includes a fuse portion 631, first through fourth block addressing portions 632, 633, 634 and 635, and first through fourth coding portions 636, 637, 638 and 639. The first through fourth block addressing portions 632, 633, 634 and 635 provide block addresses for selecting the first through fourth memory cell array blocks 610a, 610b, 610c, and 610d through the first through fourth coding portions 636, 637, 638 and 639, respectively.

The fuse portion 631 includes a plurality of fuses connected to address signal lines, with shorts or cuts of the fuses used for selecting a wordline of a defective cell in the first, second, third, or fourth memory cell array block 610a, 610b, 610c, or 610d, and providing a repair address to the first, second, third, or fourth coding portion 636, 637, 638, and 639. The first through fourth coding portions 636, 637, 638 and 639 select the first through fourth spare wordline SWLa, SWLb, SWLc, and SWLd, respectively, in response to the repair address and outputs of the first through fourth block addressing portions 632, 633, 634, and 635.

Accordingly, a data scramble having the same data pattern as that applied to the defective cell during testing is reproduced without change in a spare cell connected to the first through fourth spare wordlines SWLa, SWLb, SWLc, and SWLd. Hence, the redundancy circuit 630 in some embodiments of the present invention does not increase a chip size of a memory device while maintaining the same redundancy efficiency as that obtained by a plurality of redundancy circuits used by the first through fourth memory cell array blocks 610a, 610b, 610c, and 610d based on a twisted bitline.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A redundancy circuit for an integrated circuit memory device including a first memory cell block including a plurality of primary wordlines and a spare wordline, each associated with a plurality of memory cells; a second memory cell block including a plurality of primary wordlines and a spare wordline, each associated with a plurality of memory cells; and a plurality of bitlines extending across both the first and the second memory cell blocks the plurality of bitlines having a twisted bitline structure in which the bitlines are twisted between the first memory cell block and the second memory cell block and are not twisted within the respective memory cell blocks, wherein the redundancy circuit is coupled to the primary and spare wordlines of both the first memory cell block and the second memory cell block and wherein the redundancy circuit is configured to select the spare wordline of the first memory cell block to replace one of the primary wordlines of the first memory cell block associated with a defective cell and to select the spare wordline of the second memory cell block to replace one of the primary wordlines of the second memory cell block associated with a defective cell so that data stored in spare cells connected to a selected spare wordline have a same data scramble as that of cells connected to the corresponding replaced one of the primary wordlines.

2. An integrated circuit memory device including the redundancy circuit of claim 1, further comprising:
the first memory cell block including a plurality of primary wordlines and a spare wordline, each associated with a plurality of memory cells;
the second memory cell block including a plurality of primary wordlines and a spare wordline, each associated with a plurality of memory cells; and
the plurality of bitlines extending across both the first and the second memory cell blocks the plurality of bitlines having a twisted bitline structure in which the bitlines are twisted between the first memory cell block and the second memory cell block and are not twisted within the respective memory cell blocks.

3. The redundancy circuit of claim 1, wherein the redundancy circuit comprises:
a first block address portion that generates addresses associated with the first memory cell block;
a second block address portion that generates addresses associated with the second memory cell block;
a programmable portion that designates a repair address associated with a spare wordline to replace a defective cell; and
a coding portion that selects the spare wordline of the first memory cell block to replace the one of the primary wordlines of the first memory cell block associated with a defective cell responsive to the repair address from the programmable portion and an address from the first block address portion and selects the spare wordline of the second memory cell block to replace the one of the primary wordlines of the second memory cell block associated with a defective cell responsive to the repair address from the programmable portion and an address from the second block address portion.

4. The redundancy circuit of claim 3, wherein each of the first and second memory cell blocks include a plurality of spare wordlines.

5. The redundancy circuit of claim 4, wherein the integrated circuit memory device includes at least three memory cell blocks and the plurality of bitlines extend across the at least three memory cell blocks and have a twisted bitline structure in which the bitlines are twisted between adjacent ones of the at least three memory cell blocks and are not twisted within the respective memory cell blocks and wherein the reduncany circuit is coupled to each of the at least three memory cell blocks and is configured to select a spare wordline from a same one of the at least three memory cell blocks to replace one of the primary wordlines of the same one of the at least three memory cell blocks associated with a defective cell so that data stored in spare cells connected to a selected spare wordline have a same data scramble as that of cells connected to the corresponding replaced one of the primary wordlines.

6. The redundancy circuit of claim 3, wherein the programmable portion comprises a fuse portion including a plurality of fuses configured to be programmed to generate the repair address.

7. The redundancy circuit of claim 6, wherein the fuse portion programs the fuses by shorting or cutting the fuses according to the address of a defective cell.

8. The redundancy circuit of claim 3, wherein the coding portion comprises:
a first NAND gate coupled to the first memory cell block that receives the repair address and an address from the first block addressing portion; and
a second NAND gate coupled to the second memory cell block that receives the repair address and an address from the second block addressing portion.

9. The redundancy circuit of claim 3, wherein an address line selecting a defective cell is cut off.

10. A redundancy circuit for repairing a defective cell generated in a memory device having a twist bitline scheme, the redundancy circuit comprising:
a fuse portion including a plurality of fuses that is configured to program the fuses to generate a repair address suitable for an address of the defective cell;
block addressing portions generating block addresses for addressing memory cell array blocks, respectively, of the memory device that are divided based on a bitline twisting place; and
coding portions each selecting a spare wordline in response to the repair address and a block address for selecting a memory cell array block that has the defective cell.

11. The redundancy circuit of claim 10, wherein the redundancy circuit is shared by the memory cell array blocks.

12. The redundancy circuit of claim 10, wherein the fuse portion programs the fuses by shorting or cutting the fuses according to the address of the defective cell.

13. The redundancy circuit of claim 10, wherein the coding portions are NAND gates receiving the repair address and the block addresses, respectively.

14. The redundancy circuit of claim 10, wherein an address line selecting the defective cell is cut off.

15. The redundancy circuit of claim 10, wherein the spare wordline is arranged in each of the memory cell array blocks.

16. A method of repairing a defective cell generated in a memory device having a twist bitline scheme, the method comprising:
programming fuses to generate a repair address suitable for an address of the defective cell;

generating a block address signal for selecting a memory cell array block having the defective cell from memory cell array blocks of the memory device that are divided based on a bitline twisting scheme; and selecting a spare wordline in the memory cell array block having the defective cell in response to the repair address and the block address signal.

17. The method of claim 16, further comprising cutting an address line for selecting the defective cell.

18. The method of claim 16, wherein in the programming of the fuses, the fuses are shorted or cut according to the address of the defective cell.

* * * * *